(12) United States Patent
Akagawa et al.

(10) Patent No.: US 10,090,364 B2
(45) Date of Patent: Oct. 2, 2018

(54) ORGANIC EL DEVICE, METHOD OF MANUFACTURING ORGANIC EL DEVICE, AND ELECTRONIC APPARATUS

(71) Applicant: SEIKO EPSON CORPORATION, Tokyo (JP)

(72) Inventors: Suguru Akagawa, Matsumoto (JP); Narumi Ishibashi, Suwa (JP); Naotaka Kubota, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/142,959

(22) Filed: Apr. 29, 2016

(65) Prior Publication Data

US 2017/0005144 A1 Jan. 5, 2017

(30) Foreign Application Priority Data

Jun. 30, 2015 (JP) .................. 2015-130823

(51) Int. Cl.
*H01L 29/08* (2006.01)
*H01L 27/32* (2006.01)
*G02B 5/20* (2006.01)
*G02B 1/14* (2015.01)
*G02B 27/01* (2006.01)
(Continued)

(52) U.S. Cl.
CPC .............. *H01L 27/322* (2013.01); *G02B 1/14* (2015.01); *G02B 5/201* (2013.01); *G02B 27/0172* (2013.01); *G02B 2027/0132* (2013.01); *G02B 2027/0178* (2013.01); *H01L 51/0024* (2013.01); *H01L 51/5253* (2013.01); *H01L 51/56* (2013.01)

(58) Field of Classification Search
CPC ... H01L 27/322; H01L 51/5253; H01L 51/56; H01L 51/0024; G02B 5/201; G02B 2027/0178; G02B 2027/0132; G02B 27/0172
USPC .............................................. 257/40; 438/27
See application file for complete search history.

(56) References Cited

U.S. PATENT DOCUMENTS 6,552,488 B1 4/2003 Roitman et al.
2005/0231108 A1* 10/2005 Furukawa ......... G02F 1/133305
313/506

(Continued)

FOREIGN PATENT DOCUMENTS

JP 4768905 B2 9/2011
JP 2012-252984 A 12/2012
(Continued)

*Primary Examiner* — Vongsavanh Sengdara
(74) *Attorney, Agent, or Firm* — Oliff PLC

(57) ABSTRACT

An organic EL device includes an organic light-emitting layer provided above a first substrate; a protective layer provided above the organic light-emitting layer; a color filter provided on the protective layer; and a second substrate adhered to the color filter via an adhesive, in which a colored layer includes a first colored layer, a second colored layer, and a third colored layer, the color filter includes a first region in which the first colored layer, the second colored layer, and the third colored layer are respectively arranged as single colors and a second region in which the first colored layer, the second colored layer, and the third colored layer are arranged in a layered manner, and a height difference-relieving layer is provided between the color filter and the adhesive.

11 Claims, 10 Drawing Sheets

(51) Int. Cl.
   *H01L 51/52*     (2006.01)
   *H01L 51/56*     (2006.01)
   *H01L 51/00*     (2006.01)

(56) References Cited

U.S. PATENT DOCUMENTS

| | | | | |
|---|---|---|---|---|
| 2009/0108743 A1* | 4/2009 | Kobayashi | .......... | H01L 51/5281 313/504 |
| 2009/0179839 A1* | 7/2009 | Yamashita | .......... | G09G 3/3258 345/87 |
| 2010/0117932 A1* | 5/2010 | Yamashita | .......... | G09G 3/3233 345/55 |
| 2010/0320481 A1* | 12/2010 | Kashiwabara | ...... | H01L 27/3244 257/88 |
| 2012/0169229 A1* | 7/2012 | You | .................... | H01L 27/3244 315/51 |
| 2012/0248475 A1* | 10/2012 | Yamada | ................ | H01L 27/322 257/89 |
| 2013/0299789 A1* | 11/2013 | Yamazaki | .......... | H01L 51/5246 257/40 |
| 2014/0117334 A1* | 5/2014 | Nakamura | ............ | H01L 27/322 257/40 |
| 2014/0117842 A1 | 5/2014 | Hanamura | | |

FOREIGN PATENT DOCUMENTS

| | | |
|---|---|---|
| JP | 2013-251177 A | 12/2013 |
| JP | 2014-089803 A | 5/2014 |
| JP | 2014-089804 A | 5/2014 |

\* cited by examiner

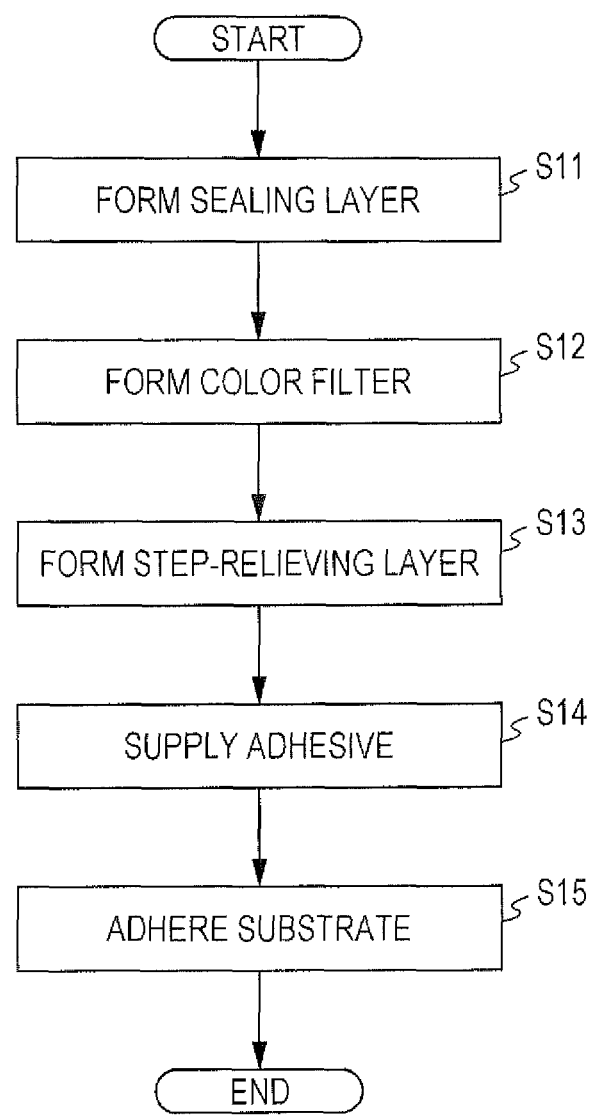

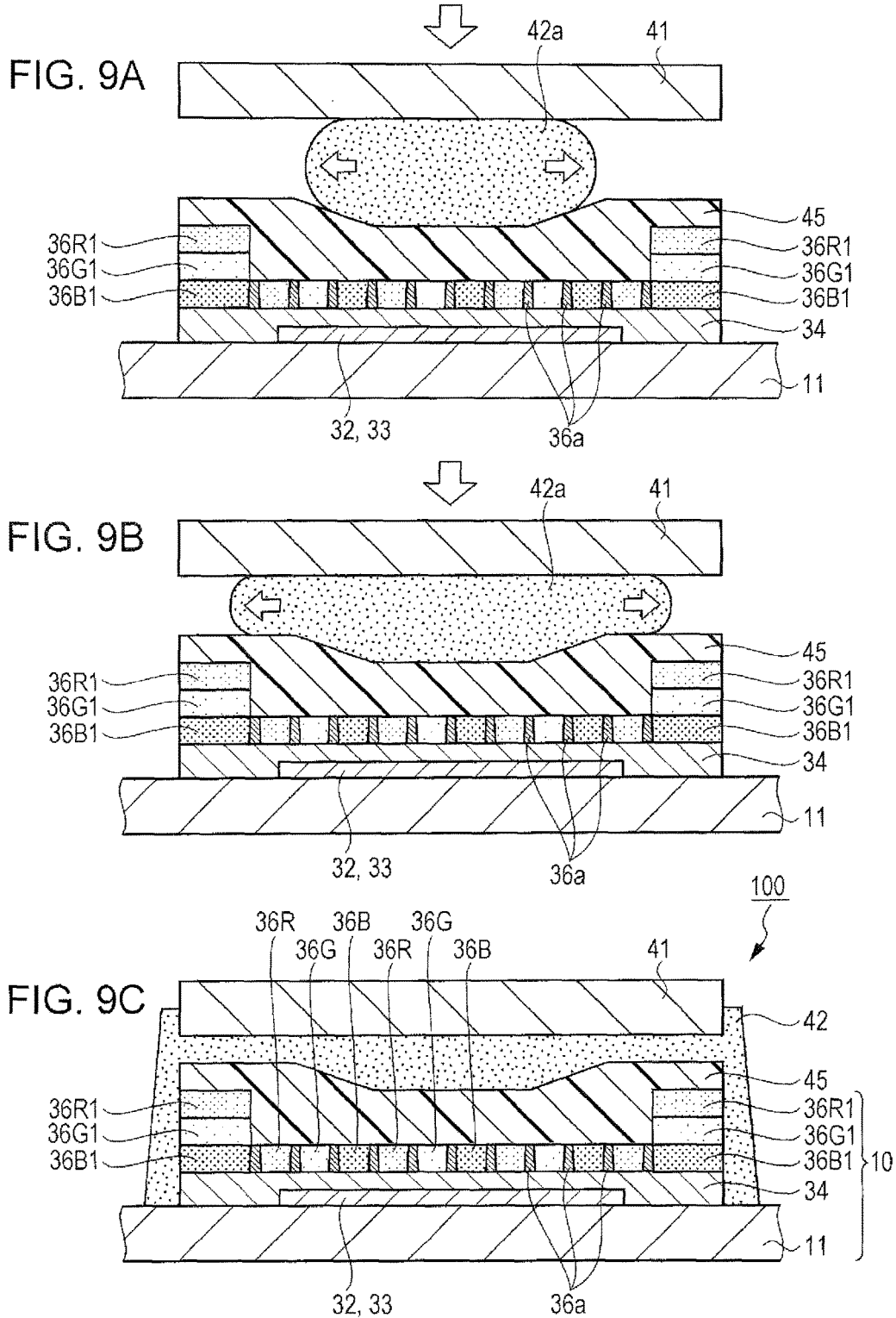

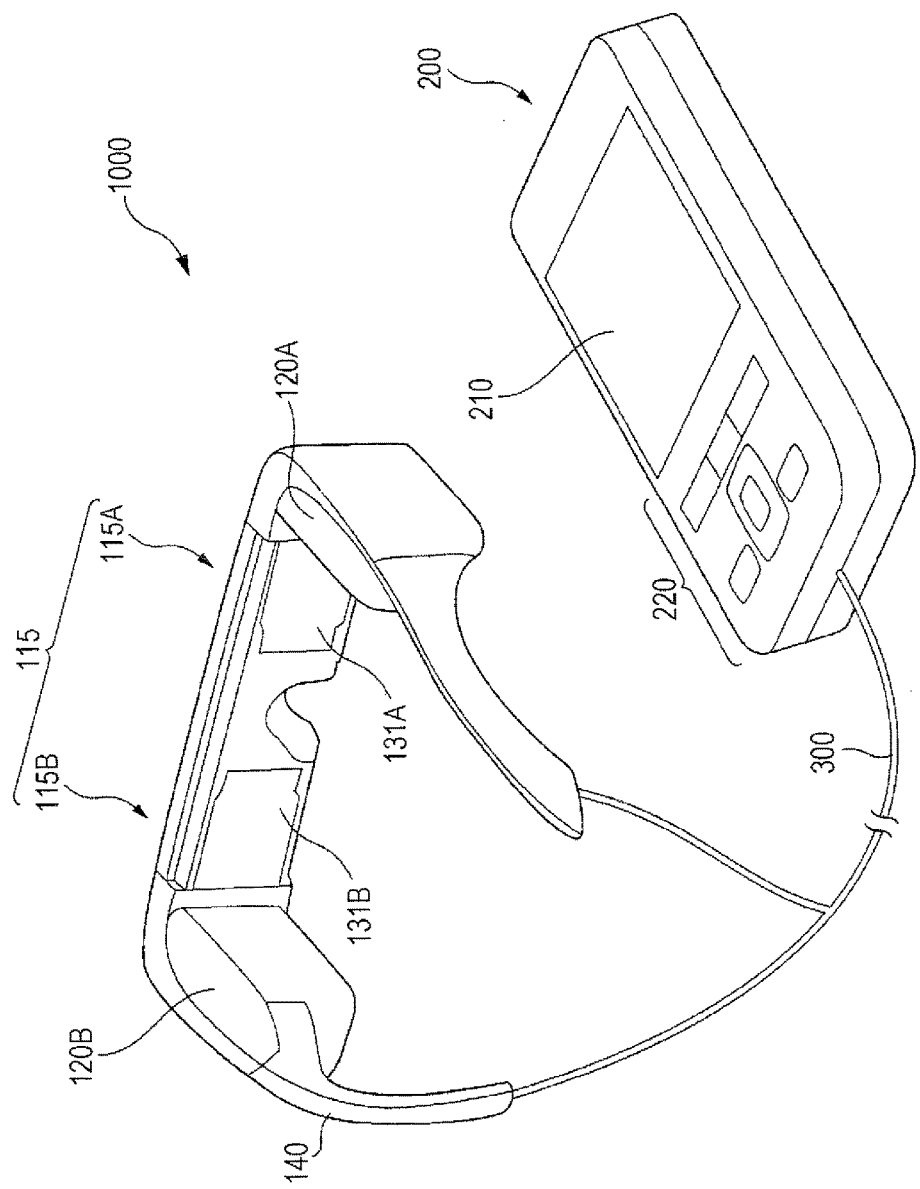

ORGANIC EL DEVICE, METHOD OF MANUFACTURING ORGANIC EL DEVICE, AND ELECTRONIC APPARATUS

BACKGROUND

1. Technical Field

The present invention relates to an organic EL device, a method of manufacturing the organic EL device, and an electronic apparatus.

2. Related Art

The organic EL (electroluminescence) device includes a light-emitting element in which a light-emitting layer formed from an organic light-emitting material is interposed between an anode (pixel electrode) and a cathode (counter electrode). The organic EL device has a color filter arranged on the upper layer of the light-emitting element with a sealing layer interposed as disclosed in JP-A-2014-89804.

The color filter is formed to have a red colored-layer, a green colored-layer, and a blue colored-layer. As illustrated in FIG. 13, an organic EL device 1 that functions as a light blocking portion (black) by layering a blue colored-layer 36B1, a green colored-layer 36G1, and a blue colored-layer 36R1 on the peripheral portion of the color filter 36 is also known.

The method of manufacturing the organic EL device 1 illustrated in FIG. 13 includes, for example, spreading an adhesive 42 over the entire surface of the color filter 36 by dropping the adhesive 42 on the central portion of the color filter 36 after forming the color filter 36 and causing the adhesive 42 to adhere to the color filter 36 by pressing the adhesive 42 with a counter substrate 41.

However, when the color filter 36 and the counter substrate 41 are adhered to each other via an adhesive 42, a problem arises in the process of spreading the adhesive 42 in that air bubbles 2 are generated (air bubbles 2 are incorporated) in the vicinity of the boundary between the display region (region where the single-color blue colored-layer 36B, green colored-layer 36G, and red colored-layer 36R are formed) of the color filter 36 and the non-display region (region where the blue colored-layer 36B1, green colored-layer 36G1 and red colored-layer 36R1 are layered), in other words, in the adhesive 42 at the portions having a large height difference, and the display quality deteriorates as a result of the air bubbles 2. Additionally, problems arise in that the adhesiveness between the color filter 36 and the adhesive 42 worsens and the counter substrate 41 separates as a result of the generation of the air bubbles 2.

SUMMARY

The invention can be realized in the following aspects or application examples.

APPLICATION EXAMPLE 1

According to the application example, there is provided an organic EL device, including a first substrate; a pixel electrode provided on the first substrate; an organic light-emitting layer provided on the pixel electrode; a common electrode provided on the organic light-emitting layer; a protective layer provided on the common electrode and formed of at least one layer; a color filter provided on the protective layer and that includes a colored layer; and a second substrate bonded to the color filter via an adhesive, in which the colored layer includes a first colored layer, a second colored layer, and a third colored layer, the color filter includes a first region in which the first colored layer, the second colored layer, and the third colored layer are each arranged and a second region in which the first colored layer, the second colored layer, and the third colored layer are arranged in a layered manner, and a height difference-relieving layer disposed between the color filter and the adhesive, the step relieving layer relieving a height difference in the colored layer between the first region and the second region.

According to the application example, since a height difference-relieving layer is provided on the color filter, the height difference in the surface (surface of the height difference-relieving layer) on the color filter can be made small even in a case where the height difference at the boundary between the first region and the second region in the color filter is large. Thus, when the first substrate side and the second substrate are adhered to each other via the adhesive, the adhesive can be easily pressed and spread from the center portion of the substrate to the periphery, and the incorporation of air bubbles in the adhesive can be suppressed. As a result, deterioration of the display quality as a result of air bubbles can be suppressed. Furthermore, worsening of the adhesiveness of the second substrate and separation of the second substrate as a result of the generation of the air bubbles can be suppressed.

APPLICATION EXAMPLE 2

In the organic EL device according to the application example, it is preferable that the color filter have a bank having transmissivity arranged between the first colored layer and the second colored layer, between the second colored layer and the third colored layer, and between the third colored layer and the first colored layer, and that the height difference-relieving layer be formed from the same material as that of the bank.

According to the application example, since the height difference-relieving layer is formed using the same material as that of the bank, the types of material used can be reduced compared to being formed with a new material, and the height difference-relieving layer can be efficiently formed.

APPLICATION EXAMPLE 3

In the organic EL device according to the application example, it is preferable that the thickness of the height difference-relieving layer of the first region be thinner than the thickness of the height difference-relieving layer of the second region.

According to the application example, since the thickness of the center region of the height difference-relieving layer is thinner than the thickness of the outside region, in other words, concave, the adhesive can be retained on the color filter before the first substrate side and the second substrate are adhered to each other. Since the height difference relationship of the base color filter is followed, for example, the concave height difference-relieving layer can be formed using only a spin coat method or the like.

APPLICATION EXAMPLE 4

In the organic EL device according to the application example, it is preferable that the thickness of the height difference-relieving layer of the first region be thicker than the thickness of the height difference-relieving layer of the second region.

According to the application example, since the thickness of the center region of the height difference-relieving layer is thicker than the thickness of the outside region, in other words, convex, the adhesive supplied to the center region of the height difference-relieving layer can be easily spread to the outside. Because there are no portions that easily retain air, compared to a case where the surface of the height difference-relieving layer is concave, the generation of air bubbles can be further reduced.

APPLICATION EXAMPLE 5

According to another application example, there is provided an organic EL device, including a first pixel electrode and a second pixel electrode provided on a first region of a first substrate; a common electrode; an organic light-emitting layer interposed between the first pixel electrode and the common electrode and between the second pixel electrode and the common electrode; a first colored layer formed on a region that overlaps the first pixel electrode in plan view; a second colored layer formed on a region that overlaps the second pixel electrode in plan view; a protective layer interposed between the first colored layer and the common electrode and between the second colored layer and the common electrode; a light blocking portion that is provided on the periphery of the first region and in which at least a first film in a same layer as the first colored layer and a second film in a same layer as the second colored layer are layered; a height difference-relieving layer formed so to provide coverage between the first colored layer or the second colored layer and the light blocking portion; a second substrate; and an adhesive interposed between the height difference-relieving layer and the second substrate.

According to the application example, since the height difference-relieving layer is provided so that the height difference between the first region and the light blocking portion is covered, the height difference in the surface of the height difference-relieving layer can be made small, even in a case where the height difference in the boundary between the first region and the light blocking portion is large. Thus, when the first substrate side and the second substrate are adhered to each other via the adhesive, the adhesive can be easily pressed and spread from the center portion of the substrate to the periphery, and the incorporation of air bubbles in the adhesive can be suppressed. As a result, deterioration of the display quality as a result of air bubbles can be suppressed. Furthermore, worsening of the adhesiveness of the second substrate and separation of the second substrate as a result of the generation of the air bubbles can be suppressed. Furthermore, the application example can be applied to a liquid crystal device in the case where the colored layer has two colors (for example, only red (R) and blue (B)).

APPLICATION EXAMPLE 6

According to still another application example, there is provided a method of manufacturing an organic EL device, including forming a pixel electrode on a first substrate; forming an organic light-emitting layer on the pixel electrode; forming a common electrode on the organic light-emitting layer; forming a protective layer formed of at least one layer on the common electrode; forming, on the protective layer, a color filter that includes a colored layer having a first colored layer, a second colored layer, and a third colored layer and that has a first region in which the first colored layer, the second colored layer, and the third colored layer are respectively arranged as single colors and a second region in which the first colored layer, the second colored layer, and the third colored layer are arranged in a layered manner; forming a height difference-relieving layer that relieves a height difference between the colored layers of the first region and the second region on the color filter; providing an adhesive to the central region of the height difference-relieving layer; and causing a second substrate to adhere to the height difference-relieving layer while pressing the adhesive.

According to the application example, since a height difference-relieving layer is formed on the color filter, the height difference in the surface (surface of the height difference-relieving layer) on the color filter can be made small even in a case where the height difference at the boundary between the first region and the second region in the color filter is large. Thus, when the first substrate side and the second substrate are adhered to each other via the adhesive, the adhesive can be easily pressed and spread from the center portion of the substrate to the periphery, and the incorporation of air bubbles in the adhesive can be suppressed. As a result, deterioration of the display quality as a result of air bubbles can be suppressed. Furthermore, worsening of the adhesiveness of the second substrate and separation of the second substrate as a result of the generation of the air bubbles can be suppressed.

APPLICATION EXAMPLE 7

In the method of manufacturing an organic EL device according to the application example, it is preferable that the forming of the color filter include forming a bank having transmissivity arranged between the first colored layer and the second colored layer, between the second colored layer and the third colored layer, and between the third colored layer and the first colored layer, and that forming of the height difference-relieving layer be performed with the same material as the material of the bank.

According to the application example, since the height difference-relieving layer is formed using the same material as that of the bank, the types of material used can be reduced compared to being formed with a new material, and the height difference-relieving layer can be efficiently formed.

APPLICATION EXAMPLE 8

In the method of manufacturing an organic EL device according to the application example, it is preferable that the forming of the height difference-relieving layer be performed so that the thickness of the height difference-relieving layer of the first region is thinner than the thickness of the height difference-relieving layer of the second region.

According to the application example, since the thickness of the center region of the height difference-relieving layer is formed thinner than the thickness of the outside region, in other words, concave, the adhesive can be retained on the color filter before the first substrate side and the second substrate are adhered to each other. Since the height difference relationship of the base color filter is followed, for example, the concave height difference-relieving layer can be formed using only a spin coat method or the like.

APPLICATION EXAMPLE 9

In the method of manufacturing an organic EL device according to the application example, it is preferable that the forming of the height difference-relieving layer be performed so that the thickness of the height difference-relieving layer of the first region is thicker than the thickness of the height difference-relieving layer of the second region.

According to the application example, since the thickness of the center region of the height difference-relieving layer is formed thicker than the thickness of the outside region, in other words, convex, the adhesive supplied to the center region of the height difference-relieving layer can be easily spread to the outside. Because there are no portions that easily retain air, compared to a case where the surface of the height difference-relieving layer is formed concave, the generation of air bubbles can be further reduced.

APPLICATION EXAMPLE 10

According to still another application example, there is provided an electronic apparatus including the organic EL device according to the above-described application examples.

According to the application example, since the organic EL device of the disclosure above is provided, an electronic apparatus that enables the display quality to be improved can be provided.

BRIEF DESCRIPTION OF THE DRAWINGS

The invention will be described with reference to the accompanying drawings, wherein like numbers reference like elements.

FIG. 6 is a flowchart illustrating the method of manufacturing the organic EL device.

FIGS. 9A to 9C are schematic cross-sectional views illustrating a portion of the manufacturing process from the method of manufacturing the organic EL device.

FIG. 10 is a schematic view illustrating a configuration of a head mounted display as an electronic apparatus.

DESCRIPTION OF EXEMPLARY EMBODIMENTS

Specific embodiments of the invention will be described below with reference to the drawings. The drawings to be used are displayed enlarged or reduced as appropriate so that the portions to be described are recognizable.

Moreover, in the following configurations, for example, where "on a substrate" is disclosed, unless otherwise specifically disclosed, there is a case where arrangement is performed so as to contact the top of the substrate, a case where arrangement is performed via another constituent component on top of the substrate, and a case where a part is arranged so as to contact the top of the substrate, and a part is arranged via a constituent component.

Organic EL Device

Figure 1:
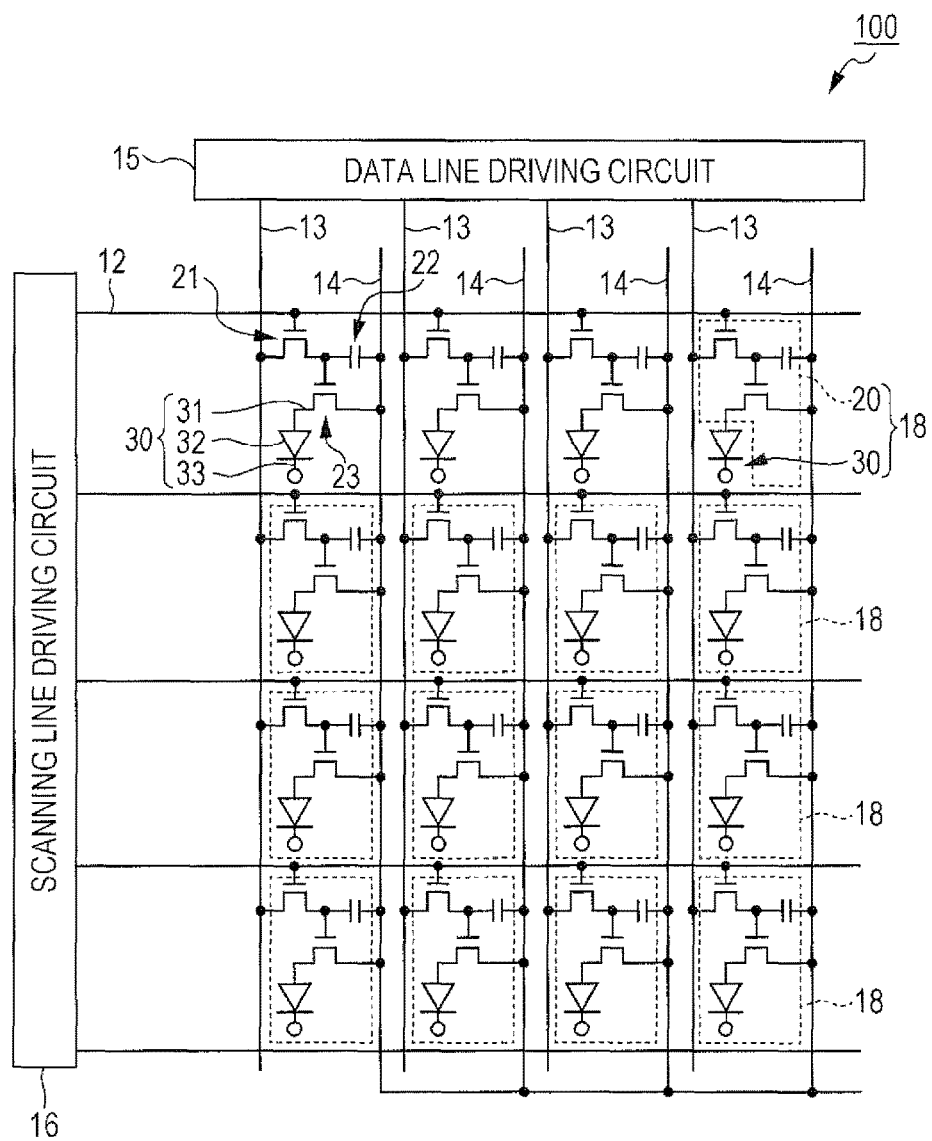
FIG. 1 is an equivalent circuit diagram illustrating an electrical configuration of an organic EL device.
Figure 2:
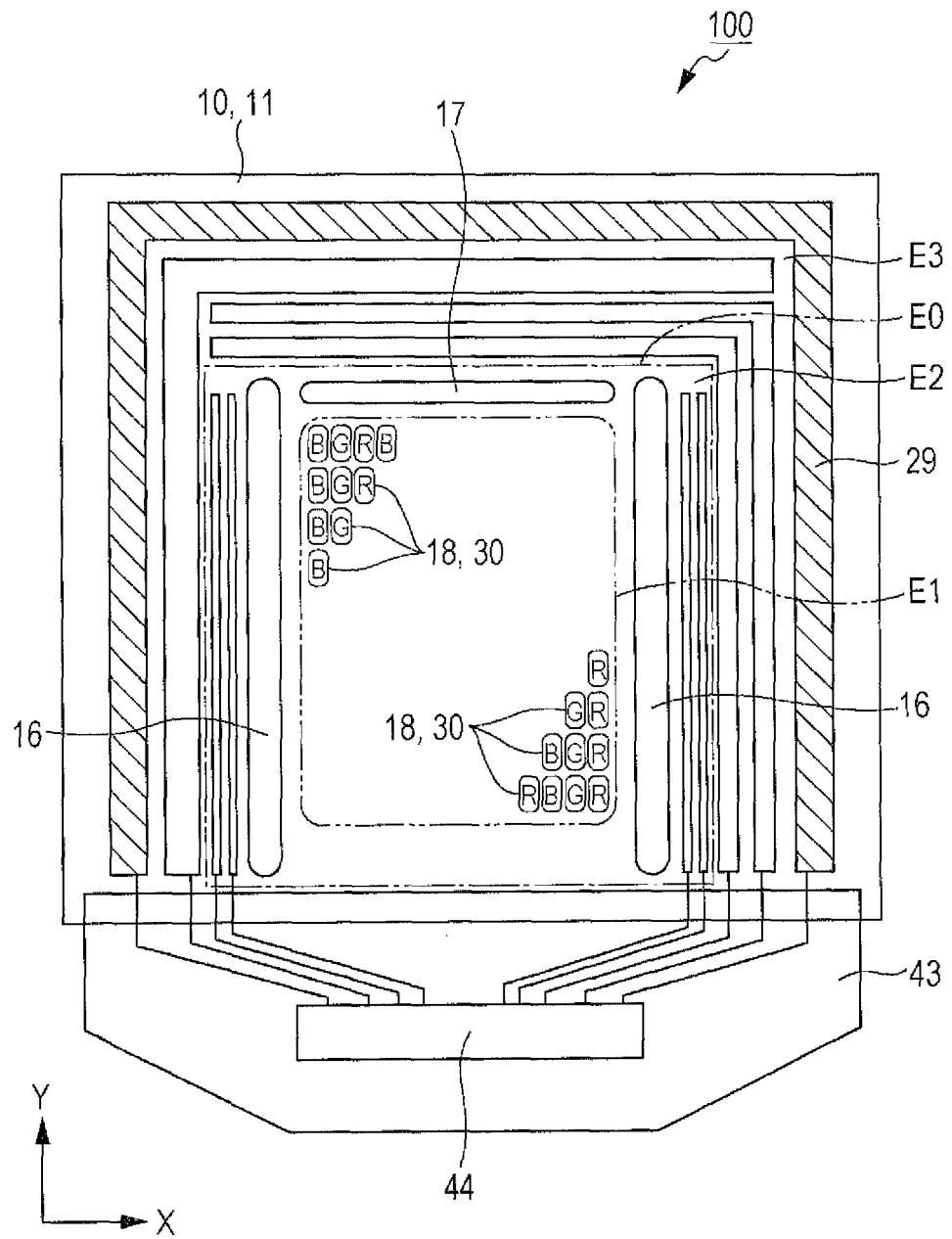
FIG. 2 is a schematic plan view illustrating a configuration of the organic EL device.
Figure 3:
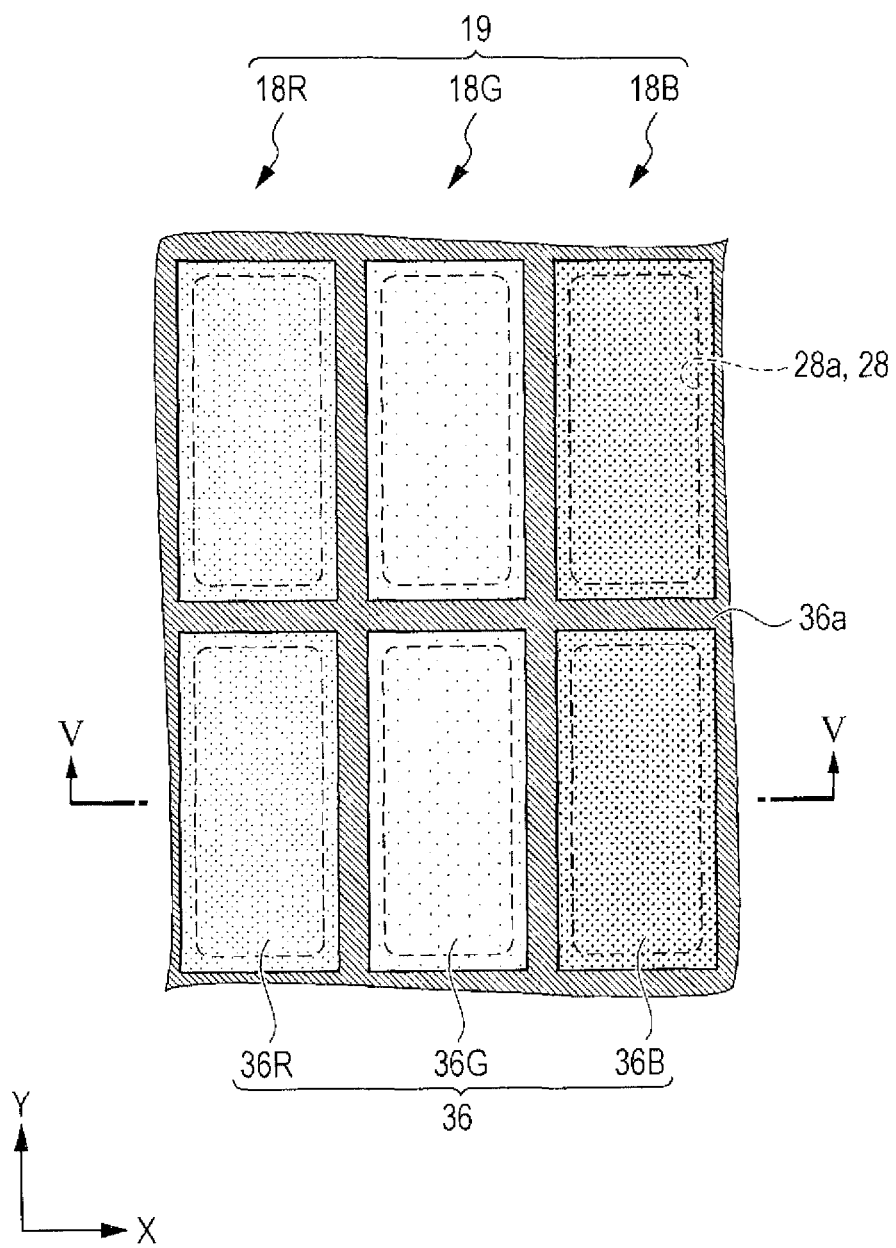
FIG. 3 is a schematic plan view illustrating the arrangement of a color filter and a sub-pixel.
Figure 4:
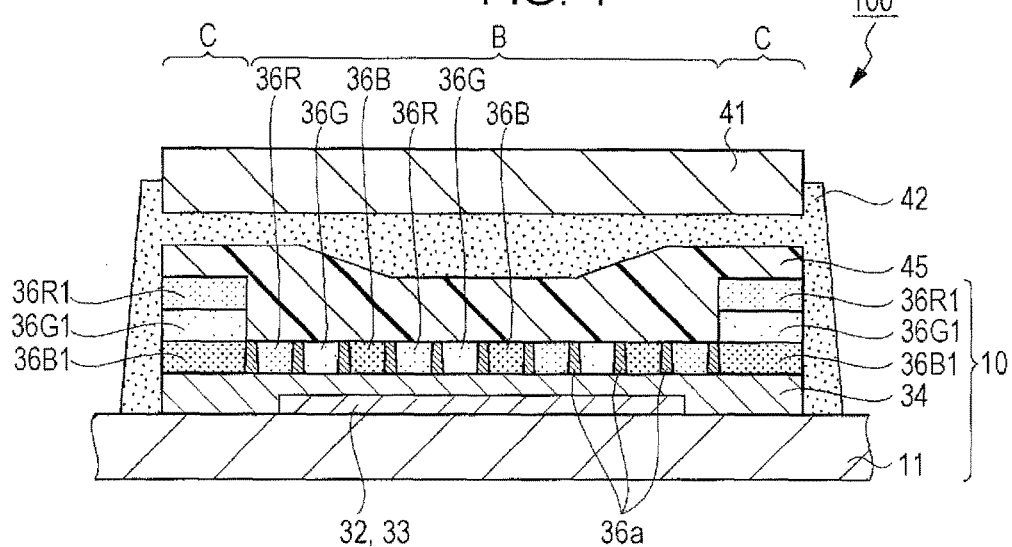
FIG. 4 is a schematic cross-sectional view illustrating an overall structure of the organic EL device.
Figure 5:
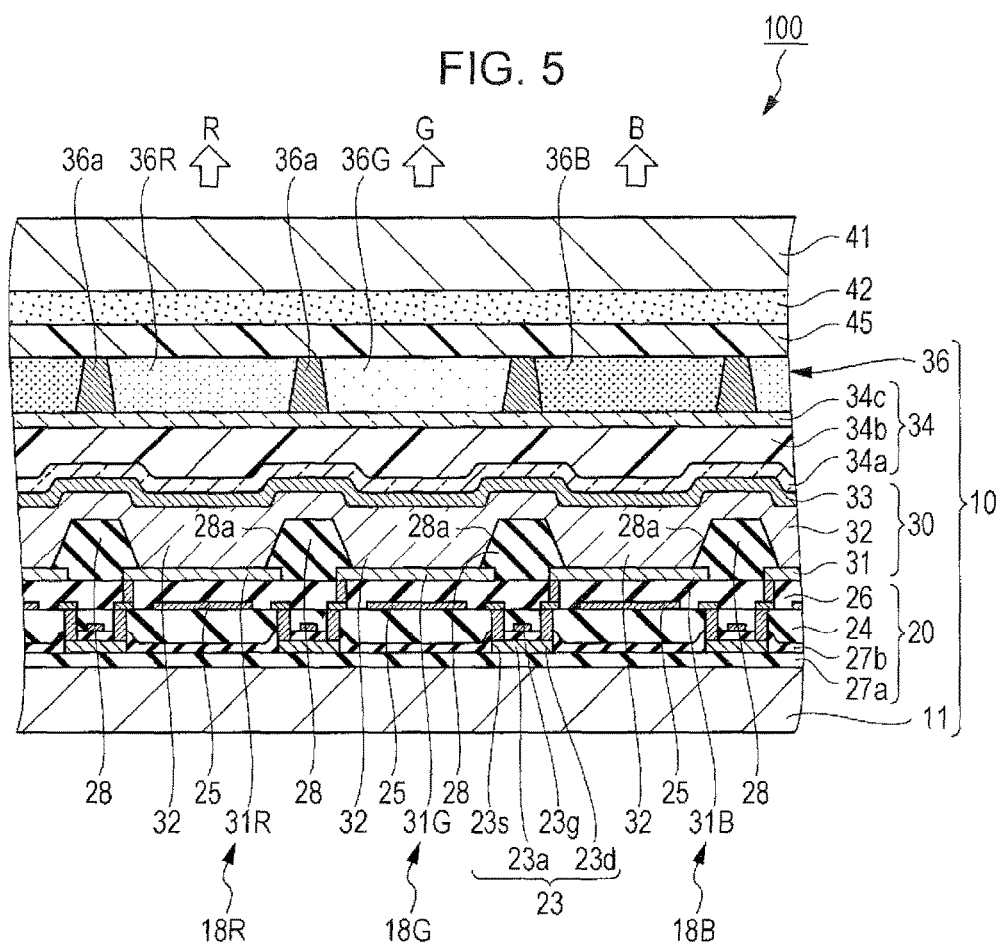
FIG. 5 is a schematic cross-sectional view illustrating a structure of the sub-pixel taken along line V-V in FIG. 3.

First, the organic EL device of the embodiment will be described with reference to FIGS. 1 to 5. FIG. 1 is an equivalent circuit diagram illustrating an electrical configuration of an organic EL device, FIG. 2 is a schematic plan view illustrating a configuration of the organic EL device, FIG. 3 is a schematic plan view illustrating the arrangement of a color filter and a sub-pixel, FIG. 4 is a schematic cross-sectional view illustrating the overall configuration of the organic EL device, and FIG. 5 is a schematic cross-sectional view illustrating a structure of the sub-pixel taken along line V-V in FIG. 3.

As illustrated in FIG. 1, the organic EL device 100 of the embodiment includes a plurality of scanning lines 12 and a plurality of data lines 13 that intersect one another, and a plurality of power lines 14 arranged to line up with respect to each of the plurality of data lines 13. The organic EL device 100 includes a scanning line driving circuit 16 to which the plurality of scanning lines 12 are connected and a data line driving circuit 15 to which the plurality of data lines 13 are connected. The organic EL device 100 includes a plurality of sub-pixels 18 arranged in a matrix corresponding to each intersection between the plurality of scanning lines 12 and the plurality of data lines 13.

The sub-pixel 18 includes an organic EL element 30 as a light-emitting element and includes a pixel circuit 20 that controls the driving of the organic EL element 30.

The organic EL element 30 includes a pixel electrode 31, a counter electrode 33 as a common electrode, and a functional layer 32 as an organic light-emitting layer provided between the pixel electrode 31 and the counter electrode 33. It is possible for such an organic EL element 30 to be denoted electrically as a diode. Although described in detail later, the counter electrode 33 is formed as a counter cathode across the plurality of sub-pixels 18.

The pixel circuit 20 includes a switching transistor 21, a storage capacitor 22, and a driving transistor 23. It is possible for the two transistors 21 and 23 to be formed using an n-channel or p-channel thin film transistor (TFT) or MOS transistor.

The gate of the switching transistor 21 is connected to the scanning line 12, one of the source or the drain is connected to the data line 13, and the other of the source or the drain is connected to the gate of the driving transistor 23.

One of the source or the drain of the driving transistor 23 is connected to the pixel electrode 31 of the organic EL element 30, and the other of the source or the drain is connected to the power line 14. The storage capacitor 22 is connected between the gate of the driving transistor 23 and the power line 14.

When the scanning line 12 is driven and the switching transistor 21 enters the ON state, a potential is held in the storage capacitor 22 via the switching transistor 21 based on an image signal supplied at this time from the data line 13.

The ON and OFF state of the driving transistor 23 are determined according to the potential of the storage capacitor 22, that is, the gate potential of the driving transistor 23.

When the driving transistor 23 is in the ON state, a current with an amount corresponding to the gate potential flows from the power line 14 to the functional layer 32 interposed between the pixel electrode 31 and the counter electrode 33 via the driving transistor 23. The organic EL element 30 emits light corresponding to the current amount flowing through the functional layer 32.

As illustrated in FIG. 2, the organic EL device 100 includes an element substrate 10. A display region E0 (in the drawing, displayed as a dotted and dashed line) and a non-display region E3 on the outside of the display region E0 are provided on the element substrate 10. The display region E0 includes an actual display region E1 (in the drawing, displayed as a double dotted and dashed line) and a dummy region E2 that surrounds the actual display region E1.

The sub-pixels 18 as the light-emitting pixels are arranged in a matrix on the actual display region E1. The sub-pixels 18 are provided with an organic EL element 30 as a light-emitting element as described above and have a configuration in which any of blue (B), green (G), and red (R) light emission is obtained according to the driving of the switching transistor 21 and the driving transistor 23.

In the embodiment, a so-called striped format arrangement of sub-pixels 18 in which sub-pixels 18 from which the same color of light emission is obtained are arranged in a first direction, and sub-pixels 18 from which a different color of light emission is obtained are arranged in a second direction that intersects (is orthogonal to) the first direction is formed. Below, a description is provided with the first direction as the Y direction and the second direction as the X direction. The arrangement of the sub-pixels 18 on the element substrate 10 is not limited to a striped format and may be a mosaic format or a delta format.

A peripheral circuit for mainly causing the organic EL element 30 of each sub-pixel 18 to emit light is provided in the dummy region E2. For example, as illustrated in FIG. 2, a pair of scanning line driving circuits 16 is provided extending in the Y direction at a position at which the actual display region E1 is interposed in the X direction. A test circuit 17 is provided at a position along the actual display region E1 between the pair of scanning line driving circuits 16.

A flexible printed circuit (FPC) 43 for achieving an electrical connection with an external driving circuit is connected to one edge portion (downward edge portion in the drawing) parallel to the element substrate 10 in the X direction. A driving IC 44 that is connected to a peripheral circuit on the element substrate 10 side via the wiring of the FPC 43 is mounted on the FPC 43. The driving IC 44 includes the above-described data line driving circuit 15, and the data line 13 and the power line 14 on the element substrate 10 side are electrically connected to the driving IC 44 via the FPC 43.

A wiring 29 or the like for imparting a potential on the counter electrode 33 of the organic EL element 30 of each sub-pixel 18 is formed between the display region E0 and the outer edge of the element substrate 10, that is, in the non-display region E3. The wiring 29 is provided on the element substrate 10 so as to surround the display region E0 except for the edge portion of the element substrate 10 to which the FPC 43 is connected.

Next, planar arrangement of the sub-pixels 18 and the main planar arrangement of the colored layers 36 (36B, 36G, 36R) and the transparent bank 36a will be described with reference to FIG. 3.

As illustrated in FIG. 3, the sub-pixel 18R from which red (R) light emission is obtained, the sub-pixel 18G from which green (G) light emission is obtained, and the sub-pixel 18B from which blue (B) light emission is obtained are arranged to line up in this order in the X direction. The sub-pixels 18 from which the same color of light emission is obtained are arranged to line up adjacent in the Y direction. The three sub-pixels 18B, 18G, and 18R arranged to line up in the X direction form a configuration in which display is achieved as one pixel 19.

The pixel electrode 31 in the sub-pixel 18 has a substantially rectangular shape, and is arranged so that the longitudinal direction follows the Y direction. The pixel electrodes 31 are made to correspond to the color of light emission and are referred to as pixel electrodes 31B, 31G, and 31R (refer to FIG. 5). An insulating film 28 (refer to FIG. 5) is formed covering the outer edge of each pixel electrode 31B, 31G, and 31R. Thereby, an opening portion 28a is formed on each pixel electrode 31B, 31G, and 31R, and each of the pixel electrodes 31B, 31G, and 31R are each exposed in the opening portion 28a. The planar shape of the opening portion 28a is also substantially rectangular.

In FIG. 3, although the arrangement of the sub-pixels 18B, 18G, and 18R with different colors have the order of red (R), green (G), and blue (B) from the left side in the X direction, there is no limitation thereto. For example, an order of blue (B), green (G), and red (R) from the left side in the X direction may be used.

Next, the structure of the organic EL device will be described with reference to FIGS. 4 and 5. FIG. 4 is a schematic cross-sectional view illustrating the overall structure of the organic EL device. FIG. 5 is a schematic cross-sectional view illustrating a structure of a sub-pixel of the organic EL device.

As illustrated in FIG. 4, the organic EL device 100 has a driving transistor 23 (refer to FIG. 5) and the like formed on a base material 11 as a first substrate that forms the element substrate 10 as described above, and a functional layer 32 having an organic light-emitting layer and the like is further provided. The functional layer 32 is covered by the counter electrode 33 (refer to FIG. 5) that functions as a cathode.

The sealing layer 34 is formed as a protective layer on the counter electrode 33 over the entirety of the counter electrode 33 and the base material 11. The color filter 36 is formed on the sealing layer 34 so as to include the region of the functional layer 32 in plan view.

The color filter 36 has colored layer 36, such as a red colored-layer 36R (first colored layer), a green colored-layer 36G (second colored layer), and a blue colored-layer 36B (third colored layer) arranged between transparent banks 36a with light transmissivity. The material of the transparent bank 36a is, for example, an epoxy resin.

The colored layer transmits at least a portion of light in the region of the peak wavelength and absorbs light in other regions. The color filter 36 includes the pixel electrodes 31R, 31G, and 31B and the color filter 36 (each colored layer 36R, 36G, and 36B) overlapped for each sub-pixel 18R, 18G, and 18B.

The outer peripheral side (non-display region side) of the color filter 36 is formed with a thicker film thickness than portions in which the blue colored-layer 36B1, the green colored-layer 36G1, and the red colored-layer 36R1 are layered and the single colored layer (36R, 36G, and 36B) of the display region is arranged.

The region (display region) in which the single colored layers 36B, 36G, and 36R are formed is the region B (first region). The region (non-display region) in which the colored layers 36B1, 36G1, and 36R1 are layered is the region C (second region). In the region C, it is possible for incident light to be absorbed. The colored layers 36B1, 36G1, and 36R1 in the region C absorb light from the organic EL element 30 in the region B or incident light from the outside.

The height of the colored layers 36B, 36G, and 36R in the region B is 1.2 µm. The preferable range is approximately 0.5 µm to 2 µm. The total height of the colored layers 36B1, 36G1, and 36R1 in the region C is 2 µm to 3 µm. The preferable range is 1 µm to 5 µm.

A height difference-relieving layer 45 is formed on the color filter 36. The height difference-relieving layer 45 is provided in order to relieve the height difference between the region B of the single color colored layers 36R, 36G and 36B and the region C of the layered colored layers 36B1, 36G1, and 36R1 in the color filter 36.

The height difference-relieving layer 45 is formed in a shape where the region B is recessed compared to region C. Specifically, the height difference-relieving layer is formed so as to have a gentle taper.

The height difference-relieving layer 45 is formed by a transparent resin. The same epoxy resin as the material of the transparent bank 36a or the planarizing layer 34b may be used as the transparent resin. A transparent acrylic resin may be used. The film thickness of the height difference-relieving layer 45 is 1 µm. The preferable range is 0.5 µm to 10 µm.

The counter substrate 41 as a second substrate is arranged on the height difference-relieving layer 45 via the adhesive 42. It is possible for an epoxy resin to be used as the adhesive 42. The film thickness of the adhesive 42 is 5 µm to 10 µm. The preferable range is 2 µm to 30 µm.

Figure 13:
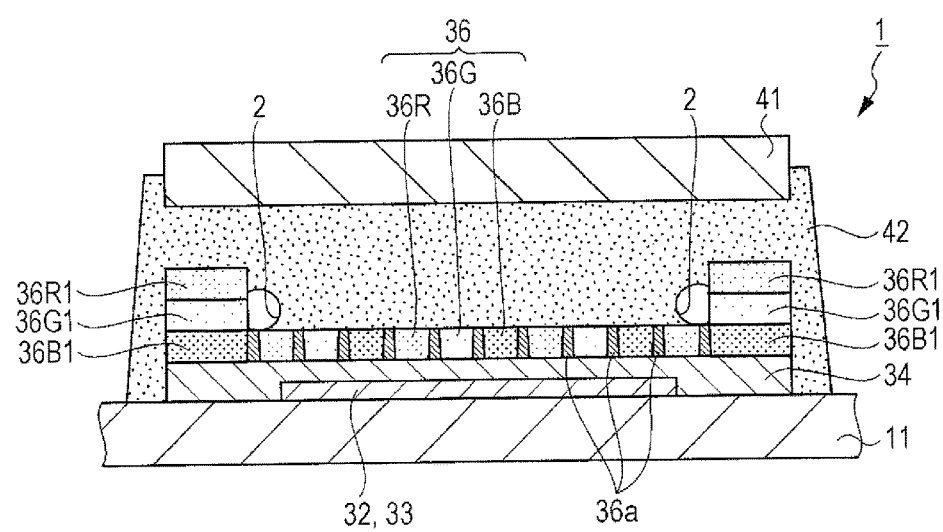
FIG. 13 is a schematic cross-sectional view illustrating a structure of the organic EL device of the related art.

By providing the height difference-relieving layer 45 In this way, it can be made more difficult for air bubbles 2 (refer to FIG. 13) to occur in the adhesive 42 when the element substrate 10 and the counter substrate 41 are adhered to each other via the adhesive 42, and it is possible to suppress the deterioration of the display quality.

Next, the structure of the sub-pixels 18R, 18G, and 18B will be described with reference to FIG. 5. As illustrated in FIG. 5, the organic EL device 100 is provided with an element substrate 10 that includes a pixel circuit 20, an organic EL element 30, a sealing layer 34 that seals a plurality of organic EL elements 30, and a color filter 36 formed in this order on the base material 11. A counter substrate 41 arranged facing the element substrate 10 is provided.

The counter substrate 41 is formed from a transparent substrate such as glass, protects the color filter 36 formed on the sealing layer 34 on the element substrate 10 and is arranged facing the element substrate 10 via the adhesive 42.

The emitted light from the functional layer 32 of the sub-pixels 18R, 18G, and 18B is reflected by the reflection layer 25, described later, and passes through the color filter 36 and is extracted from the counter substrate 41 side. That is, the organic EL device 100 is a top emission-type light-emitting device.

Because the organic EL device 100 is a top emission-type, it is possible for a transparent substrate such as glass, or a non-transparent substrate such as silicon or a ceramic to be used as the base material 11. Below, a case of using a thin film transistor in the pixel circuit 20 will be described as an example.

A first insulating film 27a is formed covering the surface of the base material 11. The semiconductor layer 23a of the driving transistor 23 in the pixel circuit 20 is formed on the first insulating film 27a. The second insulating film 27b that functions as a gate insulation layer is formed covering the semiconductor layer 23a. A gate electrode 23g is formed at a position facing the channel region of the semiconductor layer 23a with the second insulating film 27b interposed. The first interlayer insulating film 24 is formed at a film thickness of 300 nm to 2 µm covering the gate electrode 23g.

The first interlayer insulating film 24 is subjected to a planarizing process so that unevenness in the surface arising due to covering the driving transistor 23 of the pixel circuit 20 or the like is eliminated. Contact holes that pass through the second insulating film 27b and the first interlayer insulating film 24 are formed corresponding to the source region 23s and the drain region 23d of the semiconductor layer 23a, respectively.

A conductive film is formed so as to cover the contact holes, and an electrode and a wiring connected to the driving transistor 23 are formed by being patterned. The conductive film is formed using aluminum or an alloy of aluminum and Ag (silver) or Cu (copper) or the like with optical reflectivity, and a reflection layer 25 is independently formed for each sub-pixel 18 by subjecting these to patterning.

In FIG. 5, although not shown in the drawings, a switching transistor 21 and a storage capacitor 22 in the pixel circuit 20 are also formed on the base material 11.

The second interlayer insulating film 26 is formed at a film thickness of 10 nm to 2 µm covering the reflection layer 25 and the first interlayer insulating film 24. Thereafter, a contact hole for electrically connecting the pixel electrode 31 and the driving transistor 23 is formed passing through the second interlayer insulating film 26.

It is possible to use an oxide or nitride of silicon or an oxynitride of silicon as the material that forms the first insulating film 27a, the second insulating film 27b, the first interlayer insulating film 24, and the second interlayer insulating film 26.

The conductive film is formed covering the second interlayer insulating film 26 so that the contact hole formed in the second interlayer insulating film 26 is buried, and the pixel electrodes 31 (31R, 31G, and 31B) are formed by patterning the conductive film.

The pixel electrodes 31 (31R, 31G, 31B) are formed using a transparent conductive film such as indium tin oxide (ITO). In a case where the reflection layer 25 is not provided for each sub-pixel 18, the pixel electrode 31 (31R, 31G, 31B) may be formed using aluminum having optical reflectivity or an alloy thereof.

The insulating film 28 is formed covering the outer edge portion of each pixel electrode 31R, 31G, and 31B. Thereby, an opening portion 28a for formed on the pixel electrodes 31R, 31G, and 31B. The insulating film 28 is formed using an acrylic light sensitive resin and so as to surround each of the pixel electrodes 31R, 31G, and 31B at a height of approximately 1 µm.

In the embodiment, although an insulating film 28 is formed from a light sensitive resin is formed in order to create a state where the pixel electrodes 31R, 31G, and 31B are insulated from one another, each pixel electrode 31R, 31G, and 31B may be partitioned using an inorganic insulating resin such as silicon oxide.

The functional layer 32 is formed using a gas-phase process such as a vacuum deposition method or an ion plating method so as to contact each pixel electrode 31R, 31G, and 31B, and the surface of the insulating film 28 is also covered by the functional layer 32. Since it is not necessary for the functional layer 32 to cover the entire surface of the insulating film 28, and the functional layer 32 may be formed on the region partitioned by the insulating film 28, it is not necessary for the peak portion of the insulating film 28 to be covered by the functional layer 32.

The functional layer 32 includes a hole injection layer, a hole transporting layer, an organic light-emitting layer, and an electron transporting layer. In the embodiment, the functional layer 32 is formed by forming and layering in order each of the hole injection layer, hole transporting layer, organic light-emitting layer, and electron transporting layer using a gas-phase process on the pixel electrode 31. The layer configuration of the functional layer 32 is not limited thereto, and may include an intermediate layer that controls the movement of holes and electrons that are a carrier.

It is possible for the organic light-emitting layer to adopt a configuration in which an organic light-emitting layer from which red light emission is obtained, an organic light-emitting layer from which green light emission is obtained, and an organic light-emitting layer from which blue light emission is obtained are combined, as long as the configuration obtains white light emission.

The counter electrode 33 is formed covering the functional layer 32. The counter electrode 33 is formed by being formed from an alloy of Mg and Ag with a sufficient film thickness (for example, 10 nm to 30 nm) to obtain light transmissivity and optical reflectivity. Thereby, the plurality of organic EL elements 30 is completed.

An optical resonator may be formed between the reflection layer 25 and the counter electrode 33 for each sub-pixel 18R, 18G, and 18B by forming the counter electrode 33 in a state having light transmissivity and optical reflectivity.

Next, the sealing layer 34 that covers the plurality of organic EL elements 30 is formed so that water, oxygen or the like do not infiltrate. The sealing layer 34 of the embodiment has a first sealing layer 34a, a planarizing layer 34b, and a second sealing layer 34c layered in this order from the counter electrode 33 side.

It is preferable to uses a silicon-based material having light transmissivity and superior gas barrier properties, for example, silicon oxide (SiON) or the like as the first sealing layer 34a and the second sealing layer 34c. $SiO_2$ may be used.

Possible examples of the method of forming the first sealing layer 34a and the second sealing layer 34c include a vacuum deposition method and a sputtering method. Although high gas barrier properties can be realized by thickening the first sealing layer 34a and the second sealing layer 34c, on the other hand, cracking easily occurs due to expansion and contraction. Accordingly, it is preferable to control the film thickness to approximately 200 nm to 400 nm, and high gas barrier properties are realized in the embodiment by overlapping the first sealing layer 34a and the second sealing layer 34c with the planarizing layer 34b interposed.

It is possible to form the planarizing layer 34b using an epoxy resin or coating-type inorganic material (such as silicon oxide) with superior thermal stability. As long as the planarizing layer 34b is formed by coating by a printing method such as screening or a quantity discharge method or the like, it is possible to planarize the surface of the planarizing layer 34b. That is, it is possible for the planarizing layer 34b to be caused to also function as a planarizing layer that relieves the unevenness of the surface of the first sealing layer 34a. The thickness of the planarizing layer 34b is 1 μm to 5 μm.

A transparent bank 36a that forms the color filter 36 is formed on the sealing layer 34, specifically, a transparent bank 36a with the light transmissivity is formed between each colored layer 36 (red colored-layer 36R, green colored-layer 36G, and blue colored-layer 36B) that form the color filter 36.

The transparent bank 36a is formed in a matrix form in plan view, as illustrated in FIG. 3. The cross-sectional shape of the transparent bank 36a is a trapezoidal shape in which the bottom surface that contacts the sealing layer 34 is larger than the apex portion, as illustrated in FIG. 5. The transparent bank 36a is formed from a light sensitive resin material that does not include a coloring material.

The pitch between adjacent transparent banks 36a and 36a (pitch between sub-pixels 18) is, for example, 2.5 μm. The cross-section dimensions of the transparent bank 36a are a bottom surface width of approximately 1 μm, and an apex width of approximately 0.7 μm.

The colored layers 36R, 36G, and 36B corresponding to each color of sub-pixel 18R, 18G, and 18B are formed on the sealing layer 34. Examples of the method of forming the color filter 36 that includes the colored layer 36R, 36G, and 36B include a method spreading a light sensitive resin material that includes a coloring material to form a light sensitive resin layer and exposing or developing these with a photolithography method to form the color filter.

The material of the colored layer 36R, 36G, and 36B is a light sensitive resin in which an organic pigment is dispersed in a resin, such as epoxy-based, acrylic-based, polyimide-based, urethane-based, polyester-based, or polyvinyl-based. A phthalocyanine-based, azo-lake-based, condensed azo-based, quinacridone-based, a perylene-based, and a perinone-based pigment are used as the organic pigment.

More specifically, red (R) is a colored light sensitive resin in which a dianthraquinone-based pigment is dispersed in an acrylic resin. Green (G) is a colored light sensitive resin in which a phthalocyanine green-based pigment is dispersed in an acrylic resin. Blue (B) is a colored light sensitive resin in which a phthalocyanine blue-based pigment is dispersed in an acrylic resin.

A height difference-relieving layer 45 is formed on the color filter 36. The element substrate 10 is adhered to the counter substrate 41 via the adhesive 42. Possible examples of the adhesive include resin materials such as urethane-based, acrylic-based, epoxy-based, and polyolefin-based resins.

Method of Manufacturing Organic EL Device

Next, the method of manufacturing the organic EL device will be described with reference to FIGS. 6, 7A to 7D, 8A to 8D and 9A to 9C. FIG. 6 is a flowchart illustrating the method of manufacturing the organic EL device. FIGS. 7A to 9C are schematic cross-sectional views illustrating a portion of the manufacturing process from the method of manufacturing the organic EL device.

As illustrated in FIG. 6, the method of manufacturing the organic EL device 100 of the embodiment includes a sealing layer forming step (Step S11), a color filter forming step (Step S12), a height difference-relieving layer forming step (Step S13), an adhesive supply step (Step S14), and a substrate adhering step (Step S15). It is possible for the method of forming the pixel circuit 20, the organic EL element 30 and the like on the base material 11 to adopt a known method.

Accordingly, in FIGS. 7A to 9C, display of the configuration of driving transistor 23 or the like of the pixel circuit 20 on the base material 11 is omitted. Below, the steps before and after the specified parts of the invention will be described in a focused manner.

First, as illustrated in FIG. 6, in Steps S11, the sealing layer 34 is formed so as to cover the counter electrode 33.

Figure 7A:
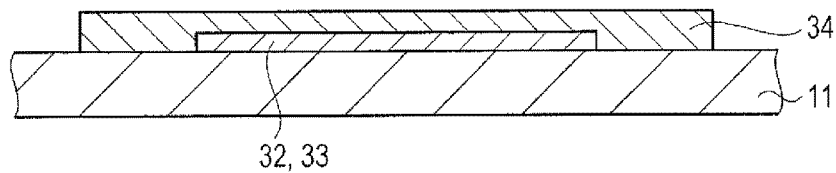
FIGS. 7A to 7D are schematic cross-sectional views illustrating a portion of the manufacturing process from the method of manufacturing the organic EL device.

Specifically, as illustrated in FIG. 7A and FIG. 5, the first sealing layer 34a is formed so as to cover the counter electrode 33, the planarizing layer 34b is formed on the first sealing layer 34a, and the second sealing layer 34c is formed on the planarizing layer 34b.

As described above, the first sealing layer 34a and the second sealing layer 34c are formed using an inorganic material such as silicon oxide. Possible examples of the method of forming the first sealing layer 34a and the second sealing layer 34c include a vacuum deposition method. The film thickness of the first sealing layer 34a and the second sealing layer 34c is approximately 200 nm to 400 nm.

The method of forming the planarizing layer 34b includes forming the planarizing layer 34b formed from an epoxy resin by using a solution including an epoxy resin having transmissivity, and a solvent for the epoxy resin, and spreading and drying the solution with a printing method or a spin coating method. The thickness of the planarizing layer 34b is 1 µm to 5 µm.

Figure 7B:
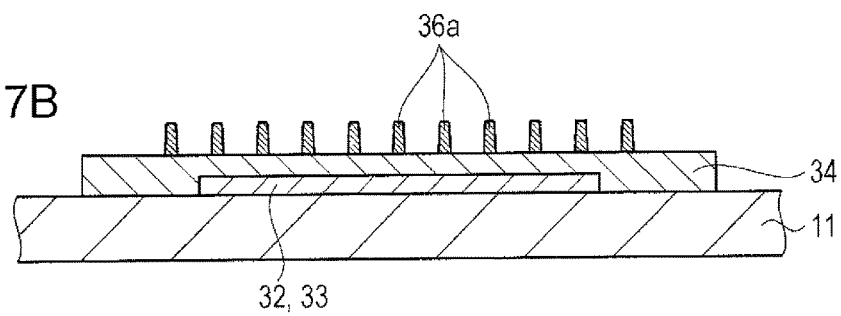

In Step S12, the color filter 36 is formed. Specifically, as illustrated in FIG. 7B, the transparent bank 36a is formed on the sealing layer 34. The method of forming the transparent bank 36a includes forming the light sensitive resin layer with a film thickness of approximately 1 µm by first spreading and prebaking the light sensitive resin material not including a coloring material using a spin coating method. The light sensitive resin material may be a positive type or a negative type.

Next, as illustrated in FIG. 7B, the transparent bank 36a is formed on the sealing layer 34 by exposing or developing the light sensitive resin material using a photolithography method. In so doing, the transparent bank 36a is formed between each colored layer 36R, 36G, and 36B that form the color filter 36. In the embodiment, the transparent bank 36a is formed in a matrix shape.

Figure 7C:
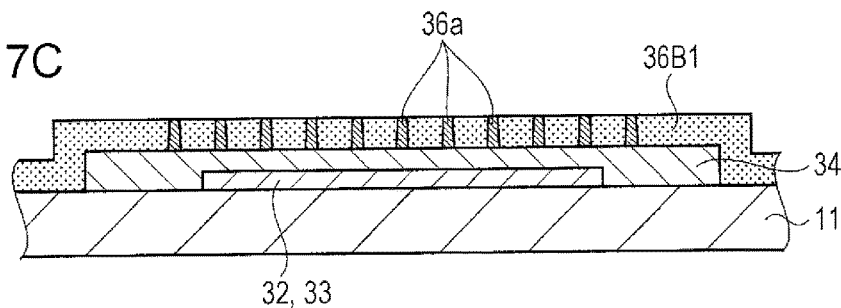

Next, each colored layer 36R, 36G, and 36B is formed. First, as illustrated in FIG. 7C, the light sensitive resin that includes a coloring material is spread over the entire surface of the base material 11 using a spin coating method or the like covering the transparent bank 36a (in FIG. 7C, blue colored-layer 36B1).

Figure 7D:
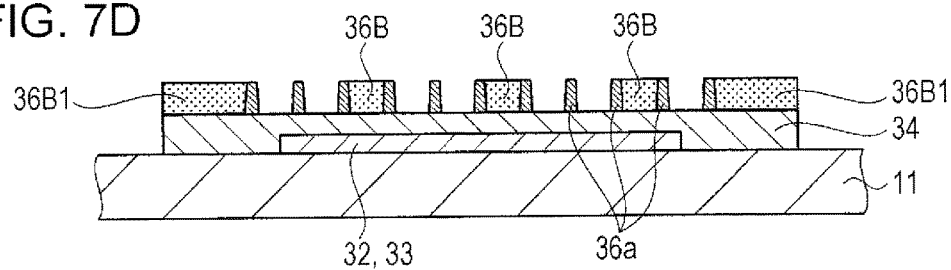

Next, as illustrated in FIG. 7D, the colored layers 36B and 3631 are formed by performing exposure or development using a photolithography method.

Figure 8A:
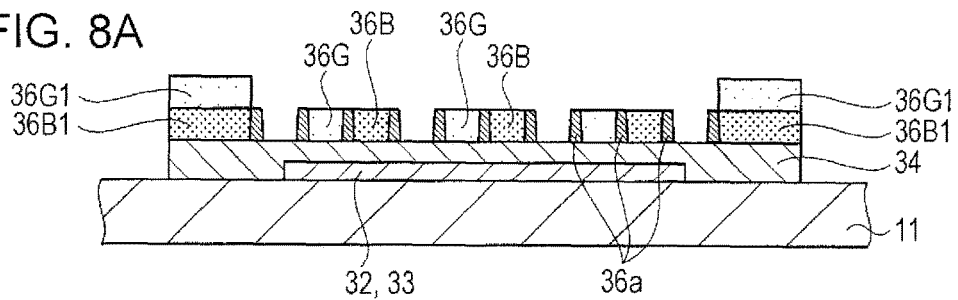
FIGS. 8A to 8D are schematic cross-sectional views illustrating a portion of the manufacturing process from the method of manufacturing the organic EL device.

Next, as illustrated in FIG. 8A, the colored layers 36G and 36G1 are formed using a spin coating method and a photolithography method.

Figure 8B:
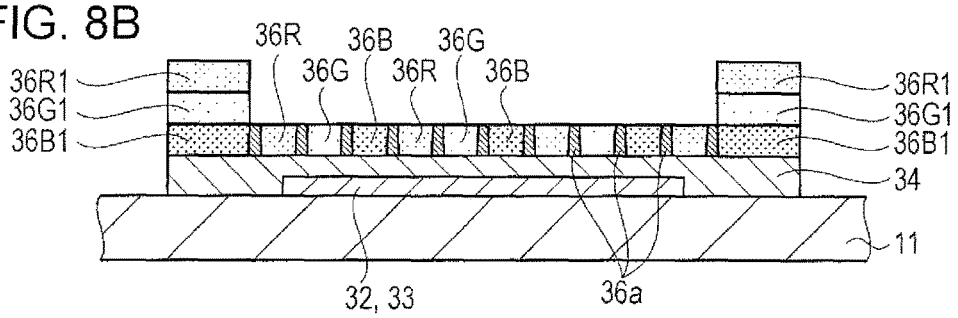

Next, as illustrated in FIG. 8B, the colored layers 36R and 36R1 are formed using a spin coating method and a photolithography method. According to the description above, each colored layer 36R, 36G, and 36B are formed between the transparent banks 36a. The three colored layers 36B1, 36G1, and 36R1 are layered on the outer circumferential side of the color filter 36.

Figure 8C:
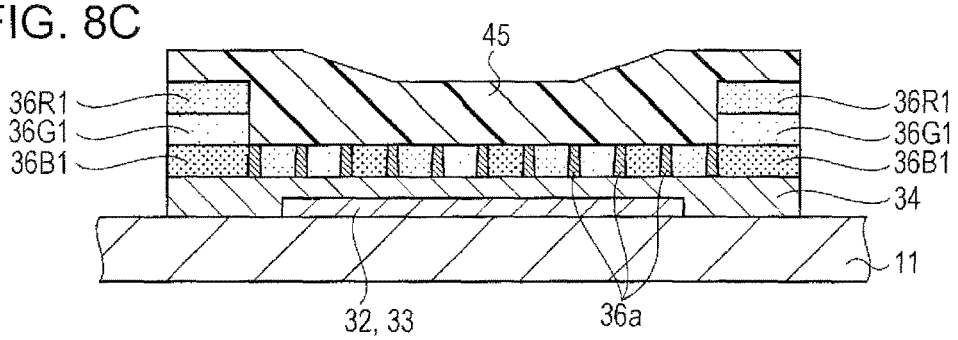

In the Step S13, the height difference-relieving layer 45 is formed. Specifically, as illustrated in FIG. 8C, the height difference-relieving layer 45 is formed on the color filter 36. It is possible for the method of forming the height difference-relieving layer 45 to use a spin coating method. It is preferable to use an epoxy resin, similarly to the planarizing layer 34b that forms the transparent bank 36a and the sealing layer 34 as the height difference-relieving layer 45, as long as an organic film is formed.

Figure 8D:
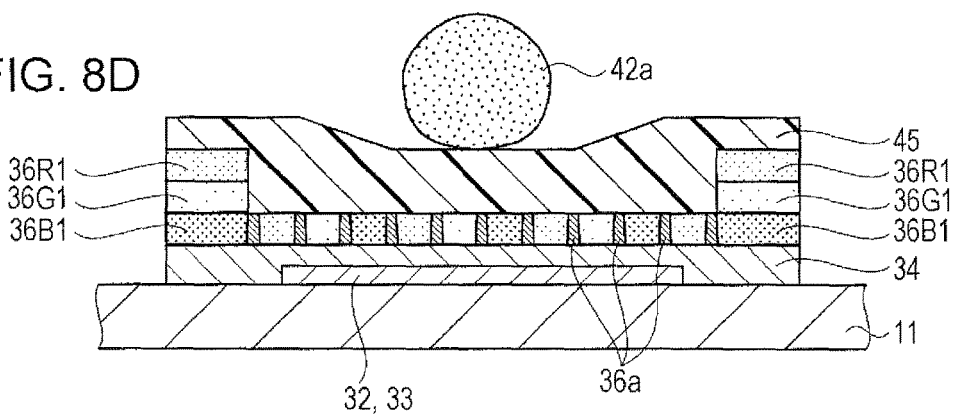

In the Step S14, the adhesive 42 is supplied. Specifically, as illustrated in FIG. 8D, the adhesive 42a is supplied to the central portion of the concave height difference-relieving layer 45. It is possible to use an epoxy resin or an acrylic resin as the adhesive 42a, as described above.

In Step S15, the substrate is adhered. Specifically, as illustrated in FIG. 9A, the counter substrate 41 is pressed against the element substrate 10 side. Furthermore, the counter substrate 41 is pressed, and the adhesive 42a is spread toward the periphery of the height difference-relieving layer 45, as illustrated in FIG. 9B.

At this time, since the height difference-relieving layer 45 is formed on the color filter 36, and the adhesive 42a is easily spread to the outside, it is possible to suppress the incorporation of air bubbles in the adhesive 42a (it is possible to suppress the generation of air bubbles in the adhesive 42a) when the adhesive 42a is pressed and spread to the outside. As described above, the organic EL device 100 is completed as illustrated in FIG. 9C.

Electronic Apparatus

Next, an electronic apparatus according to the embodiment will be described with reference to FIG. 10. FIG. 10 is a schematic view illustrating a configuration of a head mounted display (HMD) as an electronic apparatus.

As illustrated in FIG. 10, the head mounted display 1000 is provided with the organic EL device 100, and includes a main body portion 115 having a shape like spectacles, and a controller 200 having a size sufficient to be held in the hand of a user.

The main body portion 115 and the controller 200 are connected to be able to communicate in a wired or wireless manner. In the embodiment, the main body portion 115 and the controller 200 are connected to be able to communicate by a cable 300. The main body portion 115 and the controller 200 communicate with image signals or control signals via the cable 300.

The main body portion 115 is provided with a right eye display unit 115A and a left eye display unit 115B. The right eye display unit 115A is provided with an image-forming unit 120A that forms image light for a right eye image. The left eye display unit 115B is provided with an image-forming unit 120B that forms image light for a left eye image.

The image-forming unit 120A is accommodated in the temple part (right side) of the spectacles in the spectacle-type main body portion 115. Meanwhile, the image-forming unit 120B is accommodated in the temple part (left side) of the spectacles in the spectacle-type main body portion 115.

A viewing unit 131A having light transmissivity is provided in the main body portion 115. The viewing unit 131A radiates image light for the right eye image toward the right eye of the user. In the head mounted display 1000, the viewing unit 131A has light transmissivity, and is the periphery is viewable via the viewing unit 131A.

A viewing unit 1313 having light transmissivity is provided in the main body portion 115. The viewing unit 131B radiates image light for the left eye image toward the left eye of the user. In the head mounted display 1000, the viewing unit 131B has light transmissivity and the periphery is viewable via the viewing unit 131B.

The controller 200 is provided with an operation unit 210 and an operation button unit 220. The user performs operation input with respect to the operation unit 210 or the operation button unit 220 of the controller 200, and performs instructions to the main body portion 115.

According to the electronic apparatus, since the organic EL device 100 is provided, it is possible to provide a highly reliable electronic apparatus.

It is possible to use the electronic apparatus provided with the organic EL device 100 in various electronic devices in addition to the head mounted display 1000, such as a heads-up display (HUD), projector, smartphone, electrical view finder (EVF), mobile telephone, mobile computer, digital camera, digital video camera, display, vehicle mounted device, and an illumination device.

As described in detail above, according to the organic EL device 100, the method of manufacturing of the organic EL device 100, and the electronic apparatus, the effects outlined below are obtained.

(1) According to the organic EL device 100 and the method of manufacturing of the organic EL device 100 of the embodiment, since the height difference-relieving layer 45 is formed on the color filter 36, it is possible to make the height difference in the surface (surface of the height difference-relieving layer 45) on the color filter 36 to be made small, even in a case where the height difference at the boundary of the region B and the region C in the color filter 36 is large. Thus, when the element substrate 10 and the counter substrate 41 are adhered via the adhesive 42a, the adhesive 42a can be easily pressed and spread from the center portion of the height difference-relieving layer 45 to the periphery, and the incorporation of air bubbles in the adhesive 42a can be suppressed. As a result, deterioration of the display quality as a result of air bubbles 2 can be suppressed. It is possible to suppress the occurrence of display defects due to light scattering as in a case where air bubbles 2 occurring in the non-display region. Furthermore, worsening of the adhesiveness of the counter substrate 41 and separation of the counter substrate 41 as a result of the generation of the air bubbles 2 can be suppressed.

(2) According to the organic EL device 100 and the method of manufacturing the organic EL device 100 of the embodiment, since the height difference-relieving layer 45 is formed using the same material as that of the transparent bank 36a, it is possible to reduce the types of material used and to efficiently form the height difference-relieving layer compared to a case of forming the height difference-relieving layer 45 with a new material.

(3) According to the organic EL device 100 and the method of manufacturing the organic EL device 100 of the embodiment, since the surface of the height difference-relieving layer 45 is formed in a concave shape, it is possible to retain the adhesive 42a on the color filter 36 before the element substrate 10 and the counter substrate 41 are adhered to one another. Since the height difference relationship of the base color filter 36 is followed, for example, the concave height difference-relieving layer 45 can be formed using only a spin coat method or the like. Specifically, it is possible to form the height difference-relieving layer without using the chemical mechanical polishing (CMP) step. In addition since formation is performed following the base, it is possible to reduce the materials used.

(4) According to the electronic apparatus of the embodiment, since the organic EL device 100 disclosed above is provided, it is possible for the display quality to be improved.

The aspects of the invention are not limited to the above-described embodiments and are able to be appropriately changed within a range not departing from the gist or spirit of the invention read from the claims and the entire specification, and are included in the technical range of the aspects of the invention. It is possible to execute the embodiments as follows.

Modification Example 1

Figure 11:
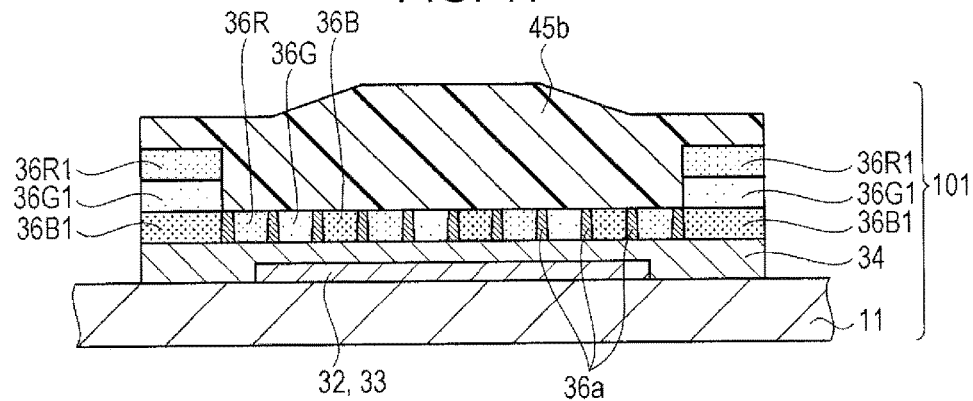
FIG. 11 is a schematic cross-sectional view illustrating the configuration of the organic EL device of a modification example.
Figure 12:
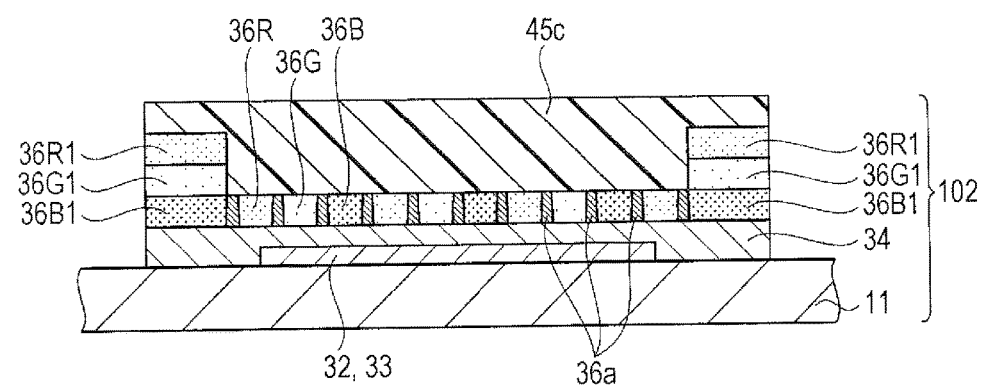
FIG. 12 is a schematic cross-sectional view illustrating a structure of the organic EL device of a modification example.

As described above, the shape of the height difference-relieving layer 45 is not limited to being a concave shape, and may be formed as follows. FIGS. 11 and 12 are schematic cross-sectional views illustrating the structure of the height difference-relieving layers 45b and 45c (element substrate 101 and 102) of the modification example.

For the height difference-relieving layer 45b illustrated in FIG. 11, the thickness of the height difference-relieving layer 45b in the center region is made thick compared to the thickness of the height difference-relieving layer 45b in the region of the outer peripheral side, in other words, convex. Thereby, it is possible for the adhesive 42a supplied to the center region of the height difference-relieving layer 45b to be easily spread to the outside. Because there are no portions that easily retain air, compared to a case where the surface of the height difference-relieving layer 45b is concave, the generation of air bubbles 2 can be further reduced. It is preferable for the method of forming the convex shape to include forming the adhesive 42a with a high surface tension using a printing method (screen printing) or the like.

The height difference-relieving layer 45c illustrated in FIG. 12 is planarized over the entire surface of the outside region from the center region. Thereby, it is possible for the generation of air bubbles in the adhesive 42a to be reduced compared to a case of a concave height difference-relieving layer 45. Furthermore, since planarization is performed, it is possible to alleviate the influence of the refractive index. It is preferable for the method of planarly forming the surface of the height difference-relieving layer 45c includes forming the height difference-relieving layer using a CMP polishing method after spreading the transparent resin material.

Modification Example 2

As described above, the material of the height difference-relieving layer 45 is not limited to being a resin material such as an epoxy resin or an acrylic resin, and an inorganic material such as silicon oxide ($SiO_2$) or polysilazane may be used. It is possible to use a chemical vapor deposition (CVD) method as the method of manufacturing the silicon oxide.

Modification Example 3

As described above, although the color filter 36 is provided with a first colored layer 36R, a second colored layer 36G, and a third colored layer 36B, there is no limitation thereto, and at least any one of the colored layers may be not included. Specifically, the sub-pixels 18R, 18G, and 18B may be formed with three colors (RGB) and the color filter with two colors (there are R and B color filters, and G is the output light from the light-emitting element used as is without a color filter). Furthermore, although there are three colors of sub-pixel 18R, 18G, and 18B, there is no limitation thereto, and there may be two colors or may be four colors or more.

Modification Example 4

As described above, although the colored layers 36B1, 36G1, and 36R1 are layered on the region C, there is no limitation thereto, any of the colored layers may be not included, and two colored layers may be layered. Four colored layers or more may be layered.

Modification Example 5

As described above, there is no limitation to applying the invention to an organic EL device 100 of the configuration, and the invention may be applied to an organic EL device having a resonator structure. In the resonator structure, the optical path length between the reflection layer and the semi-reflective and semi-transparent layer differs for each pixel and the peak wavelength of the light-emitting pixel differs, and, if the light extraction direction is a direction perpendicular to the substrate, the optical path length is set in this direction and the set wavelength of the resonator structure is shifted in a direction shifted from the perpendicular.

The entire disclosure of Japanese Patent Application No. 2015-130823, filed Jun. 30, 2015 is expressly incorporated by reference herein.

What is claimed is:

1. An organic EL device, comprising:
    a first substrate;
    a pixel electrode provided on the first substrate;
    an organic light-emitting layer provided on the pixel electrode;
    a common electrode provided on the organic light-emitting layer;
    a protective layer provided on the common electrode and composed of at least one layer;
    a color filter provided on the protective layer, the color filter including:
        a colored layer including a first colored layer, a second colored layer, and a third colored layer;
        a transparent bank arranged between the first colored layer and the second colored layer, between the second colored layer and the third colored layer, and between the third colored layer and the first colored layer;
        a first region in which the first colored layer, the second colored layer, and the third colored layer are each arranged; and
        a second region in which the first colored layer, the second colored layer, and the third colored layer are arranged in a layered manner;
    a second substrate;
    an adhesive layer that bonds the second substrate to the color filter; and
    an evening layer provided between the color filter and the adhesive layer, the evening layer relieving a height difference in the colored layer between the first region and the second region, the evening layer having a same material composition as the bank.

2. The organic EL device according to claim 1,
    wherein a height of the evening layer of the first region is lower than a height of the evening layer of the second region.

3. A method of manufacturing the organic EL device of claim 2,
    wherein forming the evening layer is performed so that the height of the evening layer of the first region is lower than the height of the evening layer of the second region.

4. An electronic apparatus comprising the organic EL device according to claim 2.

5. The organic EL device according to claim 1,
    wherein a thickness of the evening layer of the first region is thicker than a thickness of the evening layer of the second region.

6. A method of manufacturing the organic EL device of claim 5,
    wherein forming the evening layer is performed so that the thickness of the evening layer of the first region is thicker than the thickness of the evening layer of the second region.

7. An electronic apparatus comprising the organic EL device according to claim 5.

8. A method of manufacturing the organic EL device of claim 1, comprising:
    forming the pixel electrode on the first substrate;
    forming the organic light-emitting layer on the pixel electrode;
    forming the common electrode on the organic light-emitting layer;
    forming the protective layer on the common electrode;
    forming, on the protective layer, the color filter including the transparent bank and the colored layer which has: the first region in which the first colored layer, the second colored layer, and the third colored layer are respectively arranged as single colors, and the second region;
    forming the evening layer on the color filter using a same material as the transparent bank;
    providing the adhesive layer to a central region of the evening layer; and
    causing the second substrate to adhere to the evening layer while pressing the adhesive layer.

9. An electronic apparatus comprising the organic EL device according to claim 1.

10. An organic EL device, comprising:
    a first pixel electrode and a second pixel electrode provided on a first region of a first substrate;
    a common electrode;
    an organic light-emitting layer interposed between the first pixel electrode and the common electrode and between the second pixel electrode and the common electrode;
    a first colored layer formed on a region that overlaps the first pixel electrode in plan view;
    a second colored layer formed on a region that overlaps the second pixel electrode in plan view;
    a transparent bank arranged between the first colored layer and the second colored layer;
    a protective layer interposed between the first colored layer and the common electrode and between the second colored layer and the common electrode;
    a light blocking portion that is provided on a periphery of the first region and in which at least a first film in a same layer as the first colored layer and a second film in a same layer as the second colored layer are layered;
    an evening layer formed so as to provide coverage between the first colored layer or the second colored layer and the light blocking portion, the evening layer having a same material composition as the bank;
    a second substrate; and
    an adhesive layer interposed between the evening layer and the second substrate.

11. An electronic apparatus comprising the organic EL device according to claim 10.

* * * * *